(12) United States Patent
Leupold

(10) Patent No.: US 6,396,263 B1
(45) Date of Patent: May 28, 2002

(54) DEVICES AND METHODS FOR MAPPING COMPLEX MAGNETIC FIELDS THROUGH DISCRETE MAGNETIC POTENTIAL MEASUREMENTS

(75) Inventor: Herbert A. Leupold, Eatontown, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/572,486

(22) Filed: May 15, 2000

(51) Int. Cl.[7] .................. G01R 33/032; G01R 31/308; G01J 4/00
(52) U.S. Cl. ................. 324/244.1; 324/245; 324/246; 324/96; 356/368
(58) Field of Search ............................ 324/244.1, 246, 324/260, 245, 96; 356/477, 368

(56) References Cited

U.S. PATENT DOCUMENTS

| | | |
|---|---|---|
| 5,055,812 A | 10/1991 | Abele et al. |
| 5,072,204 A | 12/1991 | Leupold |
| 5,305,075 A * | 4/1994 | Bucholtz et al. ............ 356/477 |

* cited by examiner

Primary Examiner—N. Le
Assistant Examiner—Anjan K Deb

(74) Attorney, Agent, or Firm—Michael Zelenka; George B. Tereschuk

(57) ABSTRACT

A magnetic potential mapping device is provided by placing a planar polarized light source near an optically active fiber element traversing a magnetic field, so constructed that rotating planar polarized light is transmitted through the optical fiber and detected by a light detector at the fiber element's other end. The light detector measures an angle of rotation of rotating polarized light. Rotation of polarized light within the optical fiber traversing the field directly indicates magnetic potential at the point where the angle of rotation is measured, with respect to the magnetic potential at the point where the light entered the fiber element. Measuring the rotation of the polarized light passing through each fiber within the field allows mapping the magnetic potentials at any point in the magnetic field with respect to the point at which the light enters the optically active fiber. The present invention also contemplates a related method for automatically compensating a magnetic field source. This method encompasses forming an array of stationary magnetic probes positioned in the same configuration as the points to be tested in a cross section of the magnetic frame. The magnetic frame is placed over the probe array so that the probes can automatically make numerous magnetic potential measurements based on the angle of rotation of polarized light injected into the probe array. Data from these numerous measurements would be automatically provided to a data processing means to map the magnetic potential of the frame.

21 Claims, 2 Drawing Sheets

DEVICES AND METHODS FOR MAPPING COMPLEX MAGNETIC FIELDS THROUGH DISCRETE MAGNETIC POTENTIAL MEASUREMENTS

GOVERNMENT INTEREST

The invention described herein may be manufactured, used and licensed by or for the Government of the United States of America without the payment to me of any royalties thereon.

FIELD OF THE INVENTION

This invention relates to magnetic measurement devices and techniques. More particularly, this invention relates to useful devices and methods for measuring the magnetic potential of complex magnetic fields within permanent magnet structures.

BACKGROUND OF THE INVENTION

A magnetic field at any given point is composed of the x, y and z vector components. Presently, those concerned with measuring a magnetic field within the working cavity of a flux source often use a Hall probe to measure these vector components at discrete points within the field. A composite magnetic field, therefore is obtained by mapping these vector-point measurements together. The accuracy of such magnetic field measurements depends upon the limits of the Hall probe and the precision of placement and orientation of the probe within the magnetic field.

It is not desirable to use Hall probes to perform such measurements because it is extremely difficult and time-consuming to accurately place and orient Hall probes within the magnetic field to obtain the x, y and z vector components for each point's measurement. Obtaining accurate measurements at many points in a large working cavity suffers from the disadvantages of being tedious, time-consuming and potentially inaccurate. Consequently, those concerned with these magnetic fields within complex, flux source working cavities, have long felt the need for devices and methods to measure such magnetic fields without the burdens, shortcomings and disadvantages associated with Hall probes.

One solution is to measure magnetic potential instead of magnetic field. Magnetic potential is a scalar quantity rather than a three-component vector and since it is scalar it only requires one measurement, rather than three, for each point at which the magnetic field is measured, thereby eliminating the difficulties involved in the precise orientation of Hall probes at many points. Furthermore, measuring magnetic potential instead of the magnetic field allows one to estimate the error pattern. Moreover, both magnetic potential and magnetic field can be easily derived from each other so that if the spatial form of one value is determined, the other value can also be known.

Those skilled in the art know that relative magnetic potential between points can be obtained by measuring the angle of rotation that plane polarized light experiences as it traverses the distance between those points in certain materials placed in a magnetic field. Based on such measurements, the greater the difference in magnetic potential, the more the plane polarized light will rotate per distance within the magnetic field. One way of measuring this rotation is to measure the power loss component of the light traversing a fiber or rod of optically active material through the magnetic field. This can be accomplished by detecting polarized light with a light detecting means having the same planar orientation as the light entering the field. The greater the power loss, the greater the angle of rotation and, as such, the greater the magnetic potential between that point within the field and the point of entry of the light into the optically active material. There are presently no commercially available meters performing that function. The present invention provides such a long-needed measuring device to measure differences in magnetic potential, without suffering from the drawbacks, shortcomings and limitations of Hall probes. To attain this, the present invention uses fiber optic technology to measure the rotation of plane polarized light passing through the magnetic field, whereby the angle of rotation is directly indicative of the field's potential.

Similarly, there are numerous difficulties involved with field compensation in Magnetic Resonance Imaging ("MRI") magnets. Current MRI procedures place transverse magnetic fields within the interior cavities of magnetic structures surrounding the patient's body and such transverse magnetic fields must be extremely uniform to provide a clear image, necessitating tedious field compensation techniques. These transverse magnetic fields are created in tubular devices composed of a stack of magnetic frames sufficiently large to surround the patient during the procedure. It is not now possible to manufacture frames with sufficient precision to furnish magnetic fields of requisite uniformity, therefore techniques for correcting field effects of small manufacturing errors is needed. Field correction in general is described in Abele et al., U.S. Pat. No. 5,055,812, entitled "Compensation For Magnetic Nonuniformities of Permanent Magnet Structures, issued on Oct. 8, 1991. The present invention measures and corrects magnetic potentials rather than magnetic fields. During assembly, the field distribution of the magnetic slices need to be measured, made uniform and then stacked to form the requisite tubular structure.

Based on the same relationship between power loss, angle of rotation and magnetic potential, it is now possible for flawed magnetic fields to be readily and automatically measured by new methods to aid in making field corrections by correct placement of magnetic multipoles. The present invention also provides long-needed methods for automatically field compensating using a stationary probe array for numerous magnetic potential measurements from a series of magnetic slices and dipoles, without suffering from the drawbacks, shortcomings and limitations of Hall probes. The present invention also provides an improved dipole compensating method for corners of magnet slices which performs those long-needed functions without suffering from the drawbacks, shortcomings and limitations of Hall probes.

SUMMARY OF THE INVENTION

It is an object of the present invention to provide highly accurate devices utilizing fiberoptics for detecting the rotation of plane polarized light and measuring magnetic potential of complex magnetic fields located within the working cavity of a magnetic flux source.

It is another object of this invention to provide a field compensating method employing a stationary probe array.

It is a further object of this invention to provide a dipole compensating method to automatically compensate for flawed magnetic field sources by taking numerous magnetic potential measurements from a series of magnetic slices and dipoles within a stationary array of probes.

To attain the field compensation method using a stationary probe array, the methods of the present invention contemplate forming an array of stationary magnetic probes positioned in the same configuration as the points to be tested in a cross section of the magnetic frame. The magnetic frame is then placed over the array of magnetic probes. This invention's method further comprises making numerous measurements automatically and provided the data from these measurements to a data processing means in order to map the magnetic potential of the magnetic frame so that the magnetic strength and orientation of the compensating dipoles can be adjusted within the test array.

To attain the field compensation method using a stationary probe array, the methods of the present invention contemplate forming an array of stationary magnetic probes positioned in the same configuration as the points to be tested in a cross section of the magnetic frame. The magnetic frame is then placed over the array of magnetic probes. This invention's method furhte comprises making numerous measurements automatically and provided the data from these measurements to a data processing means in order to map the magnetic potential of the magnetic frame so that the magnetic strength and orientation of the compensating dipoles can be adjusted within the test array.

The mapping devices of this invention can be used in magnetic field mapping in complex, high uniformity field devices such as MRI's, electron beam devices and numerous other applications. The field and dipole compensating methods can be used for magnetic field mapping in complex, high uniformity field devices such as MRI's and numerous other applications.

The exact nature of this invention, as well as other objects and advantages thereof, will be readily apparent from consideration of the following specification relating to the annexed drawings.

DETAILED DESCRIPTION OF THE DRAWINGS

Figure 1:
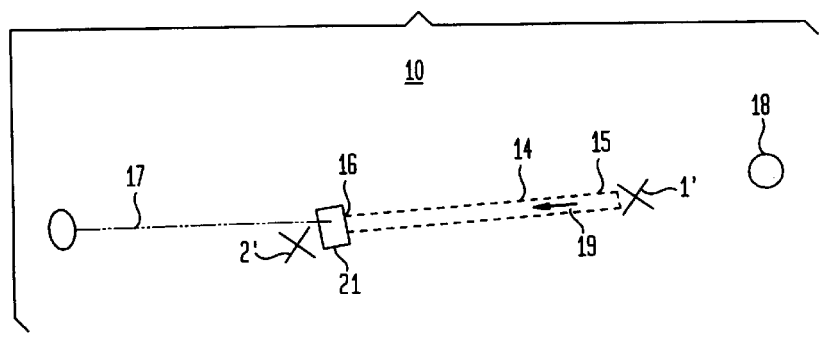
FIG. 1 is a perspective cross-sectional view of the magnetic potential mapping device of this invention.

Referring now to the drawings, FIG. 1 depicts the preferred embodiment of the magnetic potential mapping device of the present invention. The magnetic potential mapping device 10, or Gilbertometer, comprises an optically active element 14 that can be placed within the structure of interest producing a magnetic flux. The magnetic potential mapping device 10 is positioned between two imaginary reference points. At the first imaginary reference point 1', magnetic potential is defined as F=0. The magnetic field mapping device 10 also measures magnetic potential at a second imaginary reference point 2', which is located at, or within, the structure of interest. The optically active element 14, depicted in a broken line breakaway view, having a first end 15 and a second end 16 is positioned at the desired points within a structure by a positioning means 17. A light source 18 is located near the first end 15 of element 14. The element 14 transmits a plane polarized light wave, represented by arrow 19, having an angle of rotation, from the light source 18 through element 14 to a light detection means, indicated by box 21, disposed near, or on, the second end 16 of the element 14.

The magnetic potential mapping device's principle of operation is that relative magnetic potential between points can be obtained by measuring the angle of rotation that planar polarized light experiences as it traverses the distance between those points in materials, such as optically active fibers, placed in a magnetic field. The greater the difference in magnetic potential, the more the planar polarized light will rotate per distance within the magnetic field. The magnetic potential mapping device 10 of the present invention can measure these rotations.

In operation, the rotation of said plane polarized light wave 19, passing through the element 14 within the magnetic flux source directly indicates magnetic potential at the second reference point 2' where an angle of rotation of said planar polarized light wave 19, is measured. Therefore, the element 14 can be used to determine the magnetic potential at the left end 16. Said light detector means 21 measures the amount or degree of rotation by monitoring the power in the mode in which said polarized light wave 19 started at the light source 18. This measurement is possible because as the polarized light wave 19 rotates, the components of the electronic and magnetic vectors that are out of the plane of the normal mode of the wave guide are absorbed. The angle of rotation, θ, is ideally given as follows:

$$\cos\theta = \sqrt{\frac{P_2}{P_1}}$$

where $P_2$ is the measured power at the end of the path of polarized light wave 19 and $P_1$ is the measured power at the beginning of the polarized light wave 19. Of course, other losses due to normal absorption in the fiber also need to be considered but they can be easily taken into account. The amount of rotation is related to the difference in magnetic potential, F, between the two ends of said element 14 by this formula in which K is the constant characteristic of the material according to the formula:

$$\theta = K(F_2 - F_1)$$

The right end 15 of element 14, being in proximity to the light source 18, would be fixed at the first reference point 1' for which magnetic potential would be defined as $F_1=0$. Then, the left end 16 of element 14 would be placed at the second reference point 2', where the magnetic potential is to be measured. The shape that element 14 assumes will not effect the measurements because the degree of rotation depends only on the difference in magnetic potential between the left and right ends, 15 and 16, respectively. Element 14 may be fabricated so that it is flexible. Element 14 may also be positioned at the desired points within a structure by a positioning means 17. Thus this invention's magnetic potential mapping device 10 operates much like an electrical voltmeter, except that differences in magnetic potential, rather than voltage, are measured. Measurements of magnetic potential at many points within any working field of interest with respect to the zero point, or $P_1$, would then map the entire magnetic potential distribution from which the actual magnetic fields can be easily derived.

The element 14 can be an optically active fiber and can also be a rod. Further, in the case of MRI devices, magnet correction is not required because as the corrections to the structure can be made directly from the magnetic potentials.

In order to keep the mode in the optically active element 14 pure, a rectangular cross section is required. Precise placement of said left and right ends, 15 and 16, respectively, of element 14 can be achieved by an adjustment means such as an arrangement of micrometer screws. Other variations of the magnetic potential mapping device of the present invention are also possible and within the contemplation of the present invention.

This invention also provides a method to automatically compensate magnetic field sources with magnetic field corrections based on taking numerous magnetic potential measurements from a series of complementary magnetic frames and dipoles. Transverse magnetic fields placed within interior body cavities employed in MRI technology must be extremely uniform in order to provide clear images, with small non-uniformities in magnetic structure compromising the necessary uniformity. Techniques for dealing with such non-uniformities are discussed U.S. Pat. No. 5,072,204, entitled "Dipole For Magnetic Field Compensation," issued to the present inventor on Dec. 10, 1991. The methods of the present invention provide techniques for correcting field non-uniformities. The theoretical basis for dealing with such non-uniformities is described in Abele et al. U.S. Pat. No. 5,055,812, entitled "Compensation for Magnetic Non-uniformities of Permanent Magnet Structures," issued on Oct. 8, 1991 to the present inventor and others.

The present invention provides a method for making magnetic field corrections by measuring the magnetic potential of portions of the magnetic structure with a stationary means for potential sensing, rather than moving a single probe many times from point-to-point within a magnetic structure. Until now, determining the correct strength and orientation of dipole magnets within a magnetic structure was a lengthy and time-consuming process requiring many field measurements at different points within the structure. This invention's method provides for selecting a generally rectangular magnetic frame, or slice, from a magnetic flux source and then placing the frame over a stationary block of magnetic potential sensors to measure the frame's magnetic potential characteristics near, outside and within the frame's opening. The operation is then repeated on the remaining frames. This method provides simplified and efficient procedures for measuring such magnetic field characteristics, without suffering from the disadvantages of both time-consuming measurements and precise dipole placement within each magnetic slice.

Figure 2:
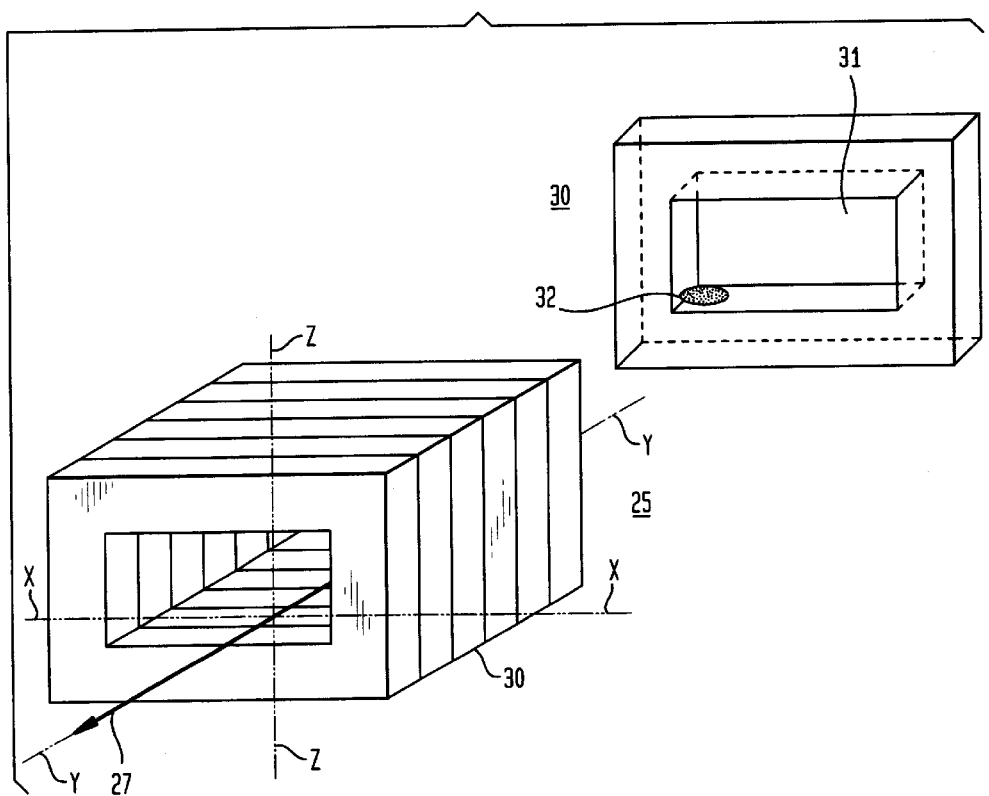
FIG. 2 is a perspective cross-sectional view of a generally rectangular cross section of magnet slices for describing the first method of the invention.
Figure 3:
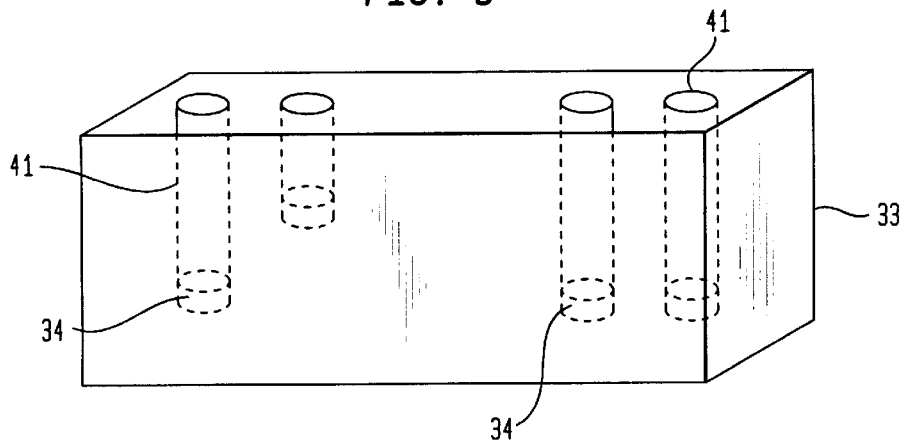
FIG. 3 a schematic perspective cross-sectional side view of a probe array used in the first method of the invention.

FIG. 2 depicts a magnetic field source 25 comprising a plurality of magnetic frames 30 and a magnetic field axis, indicated by arrow 27. A single magnetic frame 30 is separated from magnetic field source 25 to better illustrate an opening 31 and a dipole magnet 32 inserted within one corner of opening 31. As described more fully below, the dipole magnet 32 is located within an interior corner of opening 31 to correct a flawed magnetic field distribution as one of the last steps of this method. This invention's method begins by extracting a magnetic frame 30 from the magnetic field source 25. FIG. 3 is a perspective cut-away view depicting a means for potential sensing 33 having a plurality of sensors 34 arranged in the sensing means 33. The sensing means 33 is a rigid template composed of a material such as plastic in which the sensors 34 are located, and is formed to fit within opening 31 of the FIG. 2 magnetic frame 30. Each sensor 34 is positioned within a passageway 41 extending down into the interior of sensing means 33. The plurality of sensors 34 includes a light detection means, and could also include a group of this invention's magnetic field mapping devices 10, or Gilbertometers, fixed in the sensing means 33.

Figure 4:
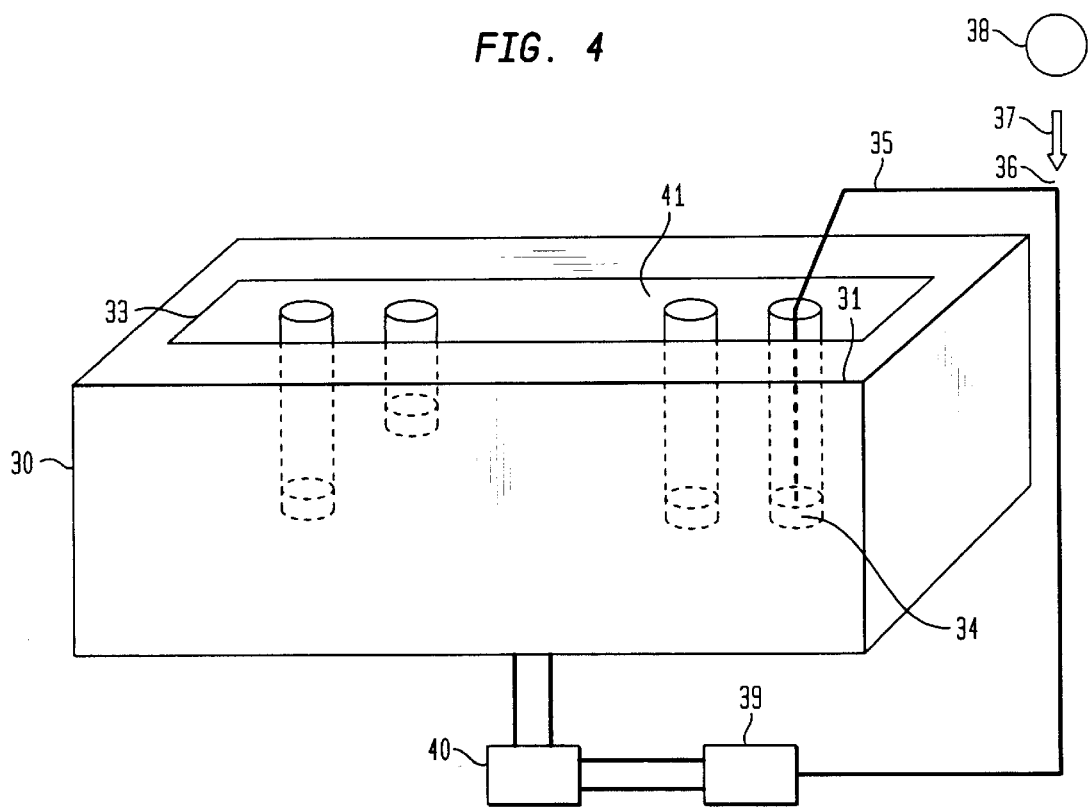
FIG. 4 is a schematic perspective cross-sectional side view of the probe array placed within a magnet slice used in the first method of the invention.

Opening 31 is initially positioned sidewise above the sensing means 33 and then lowered so that, as depicted in FIG. 4, the sensing means 33 fits within the sidewise-lying opening 31. Additional sensors 34, not shown, may also be positioned outside the magnetic frame 30. Referring now to FIG. 4, the sensing means 33 will measure a plurality of magnetic potential values of opening 31 automatically and simultaneously to generate measurement data. An optically active fiber 35 is connected to each sensor 34 and each one is gathered together at an injection point 36 where polarized light 37 from a light source 38 is injected into each optically active fiber 35. For the sake of clarity, only a single optically active fiber 35 is shown, however, in operation sufficient optically active fibers 35 for each sensor 34 would be used. Point 36 is defined at zero potential. The waves of plane polarized light 37 travel through the optically active fibers 35 to the sensors 34 of the sensing means 33 within opening 31. The waves of plane polarized light 37 rotate within the optically active fibers 35 under the influence of the magnetic field of the magnetic frame 30 and develop an angle of rotation. The sensors 34 measure the angle of rotation as the polarized light 37 passes through the optically active fibers 35, thereby measuring the magnetic potential relative to zero magnetic potential point 36.

The rotation angle of the polarized light at any sensor 34 is proportional to the difference in potential between that sensor 34 and the zero magnetic potential point 36. The data inputting and collection steps result in a map of the magnetic potentials over the entire interior of the magnetic frame 30. In a calculating step, magnetic potential calculations are performed by data processing means 39 for the ideal distribution of magnetic potential. The difference between the ideal and measured potential functions of coordinates is then Fourier-analyzed in terms of a multi-pole expansion. The dipole term is the largest term in the expansion and if this can be eliminated, sufficient precision for the purpose is usually attained in view of present magnet quality standards and machinery accuracy. During the inputting step, the measurement data are inputted into the data processing means 39, which determines the appropriate strength and orientation of the compensating dipole magnet 32. In an orientation step, this elimination can be accomplished by orienting, or placing, dipole magnet 32 in one or more of the interior corners of opening 31 of magnetic frame 30 after removal from the sensing means 33 to exactly cancel the offending term in the potential function. As part of this step, the data processing means 39 instructs a means for servo-mechanical adjustments, indicated by box 40, to orient and adjust the strength of the dipoles in the magnetic frame 30. Thus, this method permits compensating for the flaws in the magnetic field by adjusting the dipole magnets 32 in the corners of magnetic slice 30.

At this point, the same method is repeated with the multiple remaining FIG. 2 magnetic frames 30 until a sufficient quantity of corrected magnetic frames 30 can be stacked to form a magnetic flux source 25 now producing the ideal potential distribution.

Variations of the first method of the present invention include use of a cylindrical cross section rather than the generally rectangular cross section for magnetic flux source 25 and use of any conventional computing means capable of determining the appropriate strength and orientation of the compensating dipoles for data processing means 39. Additional variations include forming the sensing means 34 from a group of magnetic potential mapping devices 10 placed upright within a transparent material such as glass. This first method also encompasses combining the data processing means 39 and the servo-mechanical adjustment means 40.

It will be understood that the embodiments described herein are merely exemplary and that a person skilled in the art may make many variations and modifications to the described embodiments utilizing functionally equivalent elements to those described. Any variations or modifications to the invention just described are intended to be included within the scope of said invention as defined by the appended claims.

What I claim is:

1. A magnetic potential mapping device, comprising:

an optically active element having a longitudinal length, a rectangular cross section, a first end and a second end;

said second end is positioned at a point of interest having a given magnetic field and a given magnetic potential;

said first end being a first reference point with a known magnetic potential and said second end being a second reference point;

a light source disposed near said first end transmits a wave of plane polarized light through said element;

said wave of plane polarized light, being influenced by said given magnetic field, rotates within said element to produce a rotating polarized light wave with an angle of rotation;

a light detection means disposed near said second end measures said angle of rotation to provide a measured angle of rotation, θ, based on a difference in magnetic potential, F, between said first reference point and said second reference point, according to the formula:

$$\theta = K(F_2 - F_1)$$

where said K is a constant material characteristic of said element;

said difference in magnetic potential, F, being a relative magnetic potential;

said given magnetic field is derived from said relative magnetic potential; and determining multiple angles of rotation throughout said given magnetic field with respect to said first reference point to provide a magnetic potential distribution map of said point of interest.

2. The magnetic potential mapping device, as recited in claim 1, further comprising said measured angle of rotation, θ, is given by the formula:

$$\cos\theta = \sqrt{\frac{P_2}{P_1}}$$

where said $P_1$ is a first measured power at said first reference point and said $P_2$ is a second measured power at said second reference point.

3. The magnetic potential mapping device, as recited in claim 2, further comprising a light detection means being connected to said second end.

4. The magnetic potential mapping device, as recited in claim 3, further comprising providing a plurality of scalar components of said given magnetic field.

5. The magnetic potential mapping device, as recited in claim 4, further comprising deriving said given magnetic field from said magnetic potential distribution map.

6. The magnetic potential mapping device, as recited in claim 5, further comprising:

a direct relationship between said relative magnetic potential and the number of rotations by said rotating polarized light wave; whereby the greater said relative magnetic potential, the more that said number of rotations occurs per unit of distance within said given magnetic field.

7. The method potential mapping device, as recited in claim 6, wherein said element is an optically active rod.

8. The magnetic potential mapping device, as recited in claim 6, further comprising a means for adjustment for placement of said right end and said left end.

9. The magnetic potential mapping device, as recited in claim 8, wherein said element is an optically active fiber.

10. The magnetic potential mapping device, as recited in claim 1, further comprising said element being flexible.

11. The magnetic potential mapping device, as recited in claim 1, further comprising said point of interest being a hollow magnetic flux source.

12. A method for automatically compensating a magnetic field source, comprising the steps of:

extracting a magnetic frame from said magnetic field source, said magnetic frame having a magnetic field, a plurality of magnetic potential characteristics and an opening;

arranging a plurality of sensors in a means for potential sensing, said sensing means being transparent and said plurality of sensors including a light detection means;

forming said sensing means to fit within said opening;

positioning said opening sidewise above said sensing means, said opening surrounding said sensing means;

connecting an optically active fiber to each one of said plurality of sensors;

injecting waves of plane polarized light into said fibers at an injection point, said injection point having a zero magnetic potential;

causing said waves of plane polarized light to rotate within said fibers, said waves of plane polarized light being influenced by said magnetic field of the magnetic frame, to provide a rotating polarized light wave with an angle of rotation within each of said fibers;

measuring said angle of rotation at each of said plurality of sensors with said light detection means, providing a measured angle of rotation, θ, based on a difference in magnetic potential, F, between said zero magnetic potential at said injection point and the measurement of said angle of rotation at said sensors, said difference in magnetic potential, F, being a relative magnetic potential at each of said plurality of sensors;

inputting said measured angles of rotation into a means for data processing;

calculating said measured angles of rotation, said given magnetic field is derived from said relative magnetic potential;

determining the appropriate strength and orientation of a plurality of compensating dipole magnets; and orienting and adjusting said plurality of compensating dipole magnets within said magnetic frame based on said measured angle of rotation to automatically compensate for any flaws in said magnet field by instructing a means for servo-mechanical adjustments to adjust said plurality of compensating dipole magnets.

13. The method for automatically compensating a magnetic field source, as recited in claim 12, further comprising the step of measuring and calculating said measured angles of rotation automatically and simultaneously.

14. The method for automatically compensating a magnetic field source, as recited in claim 13, further comprising the steps of:

restoring said magnetic frame to said magnetic flux source; and extracting a multiple number of said magnetic frames for magnetic potential correction; and repeating said steps for automatically compensating said magnetic field source.

15. The method for automatically compensating a magnetic field source, as recited in claim 14, further comprising a direct relationship between said relative magnetic potential and the number of rotations by said rotating polarized light wave, whereby the greater said relative 16. The method for automatically compensating a magnetic field source, as recited in claim 15, further comprising the step of shaping said opening rectangularly.

17. The method for automatically compensating a magnetic field source, as recited in claim 16, further comprising the step of inserting at least four of said plurality of compensating dipole magnets into said opening.

18. The method for automatically compensating a magnetic field source, as recited in claim 17, further comprising the step of inserting four of said plurality of compensating dipole magnets into each corner of said opening.

19. The method for automatically compensating a magnetic field source, as recited in claim 18, further comprising the step of combining said means for servo-mechanical adjustments and said data collection means.

20. The method for automatically compensating a magnetic field source, as recited in claim 19, further comprising the step of selecting a computer for said data collection means.

21. The method for automatically compensating a magnetic field source, as recited in claim 20, further comprising the step of shaping said magnetic slice rectangularly.

* * * * *

UNITED STATES PATENT AND TRADEMARK OFFICE
CERTIFICATE OF CORRECTION

PATENT NO. : 6,396,263 B1
DATED : May 28, 2002
INVENTOR(S) : Herbert A. Leupold

It is certified that error appears in the above-identified patent and that said Letters Patent is hereby corrected as shown below:

Column 9,
Line 11, add the following after the word "relative" -- magnetic potential, the more that said number of rotations occurs per unit of distance within said magnetic field. --

Signed and Sealed this

Fifth Day of April, 2005

JON W. DUDAS
*Director of the United States Patent and Trademark Office*